United States Patent [19]

Trefonas, III et al.

[11] Patent Number: 4,983,492

[45] Date of Patent: Jan. 8, 1991

[54] POSITIVE DYE PHOTORESIST COMPOSITIONS WITH 2,4-BIS(PHENYLAZO)RESORCINOL

[75] Inventors: Peter Trefonas, III; Anthony Zampini, both of St. Louis; David C. Madoux, Maryland Heights, all of Mo.

[73] Assignee: Shipley Company Inc., Newton, Mass.

[21] Appl. No.: 203,043

[22] Filed: Jun. 6, 1988

[51] Int. Cl.$^5$ .......................... G03F 7/022; G03C 1/61
[52] U.S. Cl. ........................................ 430/191; 430/165; 430/166; 430/192; 430/193; 430/311; 430/326; 430/270
[58] Field of Search ............... 430/191, 192, 165, 166, 430/197, 270

[56] References Cited

U.S. PATENT DOCUMENTS

| | | | |
|---|---|---|---|
| 4,575,480 | 3/1986 | Kotani et al. | 430/192 |
| 4,594,306 | 6/1986 | Stahlhofen et al. | 430/165 |
| 4,618,565 | 10/1986 | White et al. | 430/166 |
| 4,626,492 | 12/1986 | Eilbeck | 430/191 |
| 4,828,960 | 5/1989 | Hertog | 430/191 |
| 4,882,260 | 11/1989 | Kohara et al. | 430/191 |

*Primary Examiner*—Charles L. Bowers, Jr.
*Attorney, Agent, or Firm*—Robert L. Goldberg

[57] ABSTRACT

This invention provides improved positive photoresist compositions containing a bis(azophenyl)resorcinol as a dye.

18 Claims, No Drawings

POSITIVE DYE PHOTORESIST COMPOSITIONS WITH 2,4-BIS(PHENYLAZO)RESORCINOL

BACKGROUND OF THE INVENTION:

1. Field of the Invention

This invention relates to positive-working photoresist compositions comprising a soluble resin, a photosensitizer, a solvent, and a dye which is soluble in both the photoresist casting solvent and also in aqueous alkaline developer. This invention further relates to a patterning method in which the noted positive-working photoresist compositions are employed. This invention is useful for achieving an improved scum-free photoresist profile shape on reflective semiconductor substrates with an improved photospeed.

2. Photoresist Technology and the Need for This Invention

It is well known in the art to produce positive photoresist formulations such as those described in U.S. Pat. Nos. 3,666,473 and 4,409,314 and European Patent Application No. 0092444. These include alkali-soluble phenolic-formaldehyde novolac resins together with light-sensitive materials. Examples of the light sensitive materials are diazoquinones (DAQs) such as the sulfonate and carboxylate esters and the sulfon- and carbonamides obtained by reacting, respectively, o-naphthoquinone diazide sulfonyl and carbonyl halides with hydroxy, polyhydroxy, amino and polyamino ballast compounds (See U.S. Pat. application No. 174,556 filed on July 18, 1950 by Maximillian Paul Schmidt and now abandoned, and U.S. Pat. Nos. 3,046,110, 3,046,122 and 3,046123). The resins and sensitizers are dissolved in an organic casting solvent or mixture of casting solvents and are applied as a dried thin film or coating to a substrate suitable for the particular application desired.

The resin component of these photoresist formulations is soluble in aqueous alkaline solutions, but the admixed naphthoquinone sensitizer acts as a dissolution inhibitor with respect to the resin. Upon exposure of selected areas of a coated substrate to actinic radiation, the sensitizer undergoes a radiation induced chemical transformation, and the exposed areas of the coating are rendered more soluble than the unexposed area. This difference in solubility rates causes the exposed areas of the photoresist coating to be dissolved when the substrate is immersed in alkaline developing solution, while the unexposed areas are largely unaffected. This produces a positive relief resist pattern on the substrate. In most instances, the imagewise-exposed and developed resist pattern resulting on the substrate will be subjected to treatment by a substrate-etchant process. The photoresist pattern on the substrate protects the resist coated areas o: the substrate from the etchant, and thus the etchant is only able to etch the remaining uncoated areas of the substrate which, in the case of a positive photoresist, correspond to the areas previously exposed to actinic radiation. Thus, an etched pattern can be created on the substrate which corresponds to the pattern of the mask, stencil, template, etc., that was used to create the latent images in the resist prior to development. The relief pattern of photoresist on the substrate produced by the method just described is useful for various applications, including the manufacture of miniaturized integrated electronic circuit components.

The term PAC as used in this present invention refers to the photoactive component of the resist composition. The PAC generally is sensitive to energetic forms of radiation such as ultraviolet (UV) light, undergoing radiation-induced chemical transformations upon exposure to such radiation.

The properties of a photoresist composition which are important in commercial practice include the photospeed of the resist, development contrast and resist resolution capability and resist sidewall angle or wall profile, and resist adhesion. Increased photospeed is important for a photoresist, particularly in applications where light of reduced intensity is employed such as in projection exposure techniques where the light is passed through a series of lenses and monochromatic filters. Increased photospeed is also particularly important in applications where a number of exposures are needed, for example in generating multiple patterns in a step-and-repeat process. Increased photospeed is also important for a resist composition employed in processes where a number of multiple exposures must be made to produce a mask or series of circuit patterns on a substrate.

Resist resolution refers to the capability of a resist system to reproduce with a given phototool the smallest multiple equal line/space features of a mask which is utilized during exposure with a high degree of image edge acuity in the developed spaces. In many industrial applications, particularly in the manufacture of miniaturized electronic components, a photoresist is required to provide a high degree of resolution for very narrow lines and spaces. The ability of a resist to reproduce very small dimensions, on the order of a micron or less, is extremely important in the production of very large scale integrated (VLSI) electronic circuits on silicon chips. Circuit density on such a chip can only be increased, assuming lithographic techniques are utilized, by increasing the resolution capabilities of the resist.

Another extremely important concern is the ability to maintain constant linewidths, feature sizes, feature shapes and sufficient thickness when positive photoresist is patterned on reflective rough semiconductor substrates or over reflective uneven topography. In this situation, light is reflected at an angle from the uneven areas of the substrate into the photoresist causing localized regions of the photoresist to receive an additional dose of light, which produces an undesirable profile shape and poor edge acuity after development. The loss of profile shape can severely harm the ability to successfully survive subsequent processing steps, such as etching of the underlying substrates. Uneven edge acuity can have highly deleterious effects on the electrical properties of the manufactured semiconductor device.

Also important is the ability to pattern the positive photoresist without leaving undesirable residual deposits, called scum, on the exposed semiconductor substrates. These scum deposits occur in some compositions of the prior art due to insolubility and incompatability of the resist components in the aqueous alkaline developer. This problem can be particularly severe with compositions of the prior art developed in aqueous metal-ion-free developers, such as aqueous tetramethylammoniumhydroxide solutions. Scum deposits can adversely affect the electrical characteristics of the device and the ability to complete further processing steps.

The positive photoresist compositions and processes provided in this invention dramatically improve performance properties on reflective semiconductor substrates while maintaining adequate photospeed. Photoresist absorbance in these compositions is increased by the addition of a bis(phenylazo)resorcinol dye which absorbs at the actinic exposure wavelength. The bis(phenylazo)resorcinol dye functions to absorb stray reflections and thus diminish undesirable profile shapes, giving excellent linewidth control and unexposed film thickness retention. The bis(phenylazo)resorcinol dye enhances the dissolution rate of the exposed photoresist in developer, thus improving photospeed relative to other dyed compositions in the prior art. Finally, the bis(phenylazo)resorcinol dye is compatable with, and soluble in, metal-ion-free aqueous alkaline developers, thus eliminating problems with undesirable scum formation on the semiconductor substrate.

3. Description of the Prior Art

In the *J. Electrochemical Society: Solid State Science and Technology* vol. 133, pp.192–196 (1986), T. R. Pampalone and F. A. Kuyan describe the effect of the addition o: Macrolex 6G dye to positive photoresist compositions. They found that the required exposure dose was increased by 220 to 520%. The sidewall angle of this composition was rather poor, about 60°–70°, indicating only moderate resolution. The dye, resins, PACs and solvents described in this publication are different from the present invention. It will be shown in the Examples that Macrolex 6G dye is not significantly soluble in aqueous alkaline developer; thus the dissolution rate was decreased, contributing to the increase in the required exposure dose.

In *Solid State Technology*, pp. 125–130, (Jan., 1988), C. A. Mack described absorption properties of two dyed photoresist compositions in an article titled "Dispelling the Myths About Dyed Photoresist". The dyes he described were Coumarin 314 and Macrolex 6G. Neither dye is soluble in developer and both are different from the present invention. The dyes, resins, PACs and solvents described in this publication are different from the present invention.

His analysis reported that dyed resist compositions may not significantly improve lithographic processing. We will show in the Examples that the dye of our invention does indeed significantly improve resist processing on reflective substrates.

U.S. Pat. No. 4,626,492 (Dec. 2 1986) claims a photoresist composition containing 10–20 percent of trihydroxybenzophenone and 0.1 to 3 percent dye, together with sensitizer and a specific novolac resin composition. The dyes claimed include anthroquinones, coumarins, diphenylmethanes, triphenylmethanes, phenanzines, oxazines, xanthenes and phenylazo(4-dialkylamino)benzene. The function of the trihydroxybenzophenone is to increase the dissolution rate of this composition, thus enhancing the light sensitivity of the photoresist. However, trihydroxybenzophenone additive has the significant disadvantage of being an invitro mutagen (TSCA Report 8E HQ-0484-0510). The dyes, resins, PACs and solvents described in this publication are different from, and inferior in performance compared to the present invention.

Japanese Pat. No. 59,142,538 (8/15/84) claims photoresist compositions containing selected phenyl- and napthyl- azo compounds, including (4-phenylazo)resorcinol. However, it will be shown in this invention that the (4-phenylazo)resorcinol component has insufficient absorbance at 436 nm to be useful as the only dye compound in the composition. The dyes, resins, PACs and solvents described in this publication are different from the present invention.

The dyed positive photoresist compositions of the present invention are distinctly different from the photoresist compositions of the prior art for the following reasons: (1) The use of bis(phenylazo)resorcinol dye compounds in a photoresist composition is new; (2) The combination of chemical components within the composition, namely the dye, resins and solvents, are new.

4. Improvements Offered by This Invention

The following combination of properties of the novel dyed positive photoresist compositions of the present invention are distinctly better than the photoresist compositions of the prior art: (1) The novel bisazo phenolic dye is soluble in aqueous alkaline developer and does not significantly inhibit the dissolution rate of the exposed photoresist film in aqueous alkaline developers; (2) The dye does not significantly harm deep-UV curing processes of the photoresist film; (3) The dye has a strong absorbance over the full range of 365 nm through 436 nm and is useful in a photoresist composition on a variety of different exposure units using 365 nm through 436 nm radiation; (4) The dyed photoresist compositions of the present invention do not cause scumming of the semiconductor substrate upon development of the exposed film; (5) The dyed photoresist compositions have substantially better resolution; (6) The dyed photoresist compositions require less exposure energy than prior dyed photoresist compositions; (7) The novel dye is non-volatile and is not readily sublimed from the resist film and (8) The novel dyed photoresist compositions are stable for at least one year without forming precipitates.

SUMMARY OF THE INVENTION

This invention provides the following:

(1) New positive photoresist compositions containing aqueous alkaline soluble bis(phenylazo)resorcinol dyes which have the advantages of high resolution, improved photospeed, non-scumming, deep-UV curable, and high absorbance over the full range of 365 nm to 436 nm, excellent stability, non-volatility, and (2) Patterning method using the compositions of the present invention.

Other objects, aspects and advantages of this invention will become apparent to those skilled in the art upon further study of this specification and attached claims.

DETAILED DESCRIPTION OF THE INVENTION

The present invention provides novel photoresist compositions which contain highly absorbant actinic bisazo phenolic dyes highly soluble in both casting solvent and aqueous alkaline developer, high resolution novolac resins, and high resolution PACs with several diazoquinone groups per molecule all dissolved into safer solvents with high solvency power. The compositions of the present invention have the advantages of high resolution capability, improved control of reflection effects, high unexposed film thickness remaining after development, increased photoresist stability, and low required exposure dose.

Enhancing the actinic absorbance of positive photoresist diminishes undesirable reflection phenomena. The absorbance at the wavelength of irradiation can be enhanced through the addition of dye to the photoresist. The optimal dye should have the following properties: highly absorbing from 365 nm to 436 nm in the spectral region to allow use of the same composition on a variety of photolithographic exposure equipment; minimal absorbance at alignment wavelengths above 520 nm; high solubility in the photoresist solvent; shelf life of at least 6 months; solubility in aqueous alkaline developers; minimal trace metals contamination; does not sublime significantly during baking processing; does not significantly harm deep-UV curing processing and does not significantly reduce the dissolution rate of exposed photoresist in developer solution.

It is well known that as the photoresist actinic absorbance is increased, resist wall angle and resolution decrease. In order to minimize the negative effect of increasing the actinic absorption on resolution, it is very important that the photoresist composition is designed to maximize the resist wall angle. Certain specific combinations of dye compound, resin chemical composition, PAC chemical structure and solvent will yield satisfactory dyed photoresist compositions.

The bisazo phenolic dyes used in the compositions of the present invention have good solubility in the casting solvent and aqueous alkaline developer and a strong absorbance in the actinic range of 365 nm to 436 nm. Solubility in the casting solvent is a complex chemical phenomenon that depends upon the chemical natures of the individual photoresist components, including the chemical functionality, type and nature of bonding, polarity, flexibility and shapes of the solvent and dye molecules. Solubility in the aqueous alkaline developer is primarily determined by the type and number of the acidic hydrophilic substituents. Examples of acidic hydrophilic substituents include acid groups and hydroxyl groups. The location and intensity of the ultraviolet/visible absorption spectrum of the dye is determined by the electronic nature of the individual dye molecule and its interactions with the other molecules in the photoresist composition.

The dye used in the photoresist compositions of the present invention is bis(phenylazo)resorcinol, formula #1. This dye is soluble in photoresist casting solvent and aqueous alkaline developer and has a strong absorption in the spectral region of 365 nm to 436 nm. Bis(-phenylazo)resorcinol is useful as a single dye ingredient of the composition, or in combination with other dyes in the composition. The dye of the present invention has a strong absorption throughout the spectral region of 365 nm to 436 nm.

In the *Proceedings of the SPIE*, vol. 771, pp. 194-211 (1987), it was shown that contrast, which is generally a measure of resolution, increases in direct proportion to the number of photoactive sites per molecule of PAC if appropriate developers and resins are combined.

Accordingly, the most preferred PACs of the present invention have, on the average, greater than one DAQ group per molecule. Examples of PACs with 1 or more DAQ groups per molecule are polyesters of formulae #2 through #4.

Several compounds are examined in this invention as casting solvents for a dyed photoresist composition. These include ethylene glycol monoethyl ether acetate (EGMEA), propylene glycol methyl ether actetate (PGMEA), anisole, ethyl lactate, methyl lactate, ethyl-2-ethoxy acetate, methyl-2-methoxy acetate, methyl-2-methoxy proprionate, pyruvic aldehyde dimethyl acetal, amyl acetate, butyl acetate, and hexyl acetate. Many of these solvents can be used as the only solvent. Other solvents such as anisole and alkyl acetates, can be used in combination with other solvents to give better solvency and lithographic performance.

The most preferred solvents of this invention are ethyl lactate and blends of ethyl lactate with cosolvents such as anisole and amyl acetate. These solvents give a useful combination of low required exposure dose, good solvency, low toxicity and useful volatility.

The casting solvents of the present invention must be capable of forming a stable non-reactive solution of dye, resin and PAC. The solvent must also be carefully chosen to cast acceptable photoresist films for semiconductor manufacturing. The casting solvent must also have sufficient volatility to be essentially removed from the photoresist film during a typical baking process.

Many of these solvents also can reduce the required exposure dose of the resist. Residual solvent in the photoresist will modify the dissolution rate of the resist, which can affect the required exposure dose. In addition, some solvents may affect film densification during the baking step, which can also impact photospeed.

Additional important considerations of solvent choice include solvent cost and low toxicity. Many of the solvents of this invention are available in low cost and have little or no known toxicological concerns.

The most preferred compositions of the present invention include:

(a) from about 75 to about 92 percent of a mixture of a base soluble phenolic resin and a dye or mixture of dyes, the proportions by weight of said dye(s) are about 0.4 percent to about 8 percent of the weight of resin, wherein said dye is a bis(phenylazo)resorcinol, formula 1;

(b) from about 8 to about 25 percent of a 0-naphthoquinone diazide sulphanate ester of a polyester of a polyhydroxy ballast compound of the type illustrated in formulae 2 through 4.

EXAMPLES

The following specific examples provide detailed illustrations of the methods of conducting the processes and producing and using the compositions of the present invention. These examples are not intended, however, to limit or restrict the scope of the invention in any way, and should not be construed as providing conditions, parameters or values which must be utilized exclusively in order to practice the present invention.

EXAMPLES 1 through 3 describe the synthesis of base soluble phenolic resins used in the positive photoresist compositions described in this invention.

EXAMPLE 1

Novolac Resin from m-, p-m and o-Cresols

A 2-L four-neck resin kettle equipped with a stirrer, heating source, thermometer, variable reflux ratio distilling head and a nitrogen inlet tube was charged with 278.3 g (99 percent pure) m-cresol, 335.5 g (99 percent pure) p-cresol, 34.3 g (99 percent pure) o-cresol, 68.3 g of 36.9 percent formalin, 20 ml of deionized water and 12.0 g of oxalic acid dihydrate. The mixture was heated to about 60° C. at which point an exothermic condensation reaction ensued. When the reaction mixture temperature reached about 100° C., 273.3 g of 36.9 percent formalin was added in about 30 minutes. The reaction was then allowed to continue for about 4 hours at reflux temperature. The more volatile components in the reaction mixture were removed by distillation at ambient pressure under a constant flow of nitrogen. When the temperature of the reaction mixture reached about 220° C., a partial vacuum pressure was applied and was gradually increased until a maximum vacuum of 7 mm Hg was achieved and the mixture was at about 228° C. The liquefied resin remaining in the kettle was poured into a tray under nitrogen and allowed to cool and solidify. About 516 g (amount) of novolac resin having a glass transition temperature, Tg, of about 100° C. was obtained.

EXAMPLE 2

Novolac Resin from m-Cresol and 2,6-Bis(hydroxymethyl)-p-cresol

A phenolic resin rich in alternating phenolic copolymer block segments was formed by reacting a mixture of 519.0 g of 99 percent pure m-cresol, 538.2 g 97 percent pure 2,6-bis(hydroxymethyl)-p-cresol and 20 g oxalic acid dihydrate in a solvent mixture of 40 ml deionized water and 200 ml ethyl cellosolve acetate. The reaction mixture was heated to about 70° C. to initiate the reaction forming the copolymer block segments. At 102° C., 32.6 g of 36.9 percent formaldehyde was added in 8 minutes to the reaction mixture to form substantially m-cresol formaldehyde block segments and to chemically bond these segments to the previously formed copolymer blocks. After heating the mixture at reflux for three hours, the amount of heat was increased to remove the water and solvent by distillation. Partial vacuum was applied at about 220° C. and gradually increased to 4 mm Hg to remove the unreacted monomers. Maximum mixture temperature during vacuum stripping was about 226° C. The copolymer was poured from the reaction kettle and allowed to cool. About 840 g of product having a Tg of 112° C. was obtained.

EXAMPLE 3

Benzaldehyde Resin Synthesis

A mixture of 162.2 g m-cresol, 111.4 g benzaldehyde, 55.0 g salicylaldehyde, 3.0 g 3-mercaptopropionic acid, 1.1 g p-toluenesulfonic acid and 75 ml diglyme were charged into a 1 liter reaction vessel equipped with a paddle stirrer, reflux condenser and a nitrogen inlet tube. The mixture was heated to reflux and maintained at reflux for 4 hours. The more volatile components in the reaction mixture were distilled at ambient pressure until the mixture temperature climbed to about 170° C. This temperature was maintained for two hours before the reaction mixture was cooled and diluted with 300 ml of a 1:2 acetic acid-methanol mixture. The product was precipitated into 2.3 liters deionized water, washed with water and dried under vacuum at about 115° C. About 293 g of a beige powder suitable as binder in resist compositions was obtained. EXAMPLES 4, 5 and 6 describe the synthesis of the PACs used in the positive photoresist compositions described in this invention.

EXAMPLE 4

An O-naphthoquinone diazide sulfonate Mixed Ester of 2,3,4-Trihydroxybenzophenone To a 25-L flask equipped with a constant temperature bath, thermometer, mechanical stirrer, and 2 1-L addition funnels were added 550 g (2.50 moles) of 2,3,4-trihydroxybenzophenonem 750 g (2.80 moles) of 1-oxo-2-diazonaphthalene-5-sulfonyl chloride and 11.350 L of reagent grade acetone. While the mixture was maintained at 20° C.±0.3° C., 1425 g (1.61 moles) of 12 percent sodium carbonate was added dropwise over 100 minutes. After the base addition, the reaction mixture was allowed to stir for 60 minutes at about 20° C. 250 ml of concentrated HCl was then slowly added to the mixture while keeping its temperature below 26° C. The reaction solution was filtered to remove the bulk of the NaCl, and the filtrate was added to 50 L of 1 percent HCl. The precipitated solid was stirred one hour, filtered and collected. The solid was slurried twice in 25 L of deionized water, filtered and vacuum dried to 0.1 mm Hg at ambient temperature. About 1100 g (85 percent of the theory) of a yellow, free flowing product containing about 34 percent by weight triester was obtained. By changing the ratio of the 1-oxo-2-diazonaphthalene-5-sulfonyl chloride to 2,3,4-trihydroxybenzophenone, the percent by weight of triester in the PAC product, and thus the percent by weight of PAC molecules without acidic hydrophilic groups, can be adjusted as desired. The resulting compound is that of formula 2.

EXAMPLE 5

Oxo-diazonaphthalene-sulfonate Esters of Alpha,alpha'-bis(2,3,4-trihydroxyphenyl)-1,4-diisopropylbenzene In a 5-L 3-neck round bottom flask equipped with a thermometer, mechanical stirrer, and a 1-L addition funnel, 69.5g (0.17 moles) of alpha, alpha'-bis(2,3,4-trihydroxyphenyl)-1,4-diisopropylbenzene and 344 g (1.17 moles, 15 percent excess) of 1-oxo-2-diazonapthalene-5-sulfonyl chloride was dissolved in 3 L of acetone at ambient temperature. After the dissolution was completed, 300 ml of deionized water was slowly added, followed by 5 g of dimethylaminopyridine. To the resulting mixture 118 g (1.17 moles) of triethylamine was added dropwise with stirring at such a rate as to keep the temperature at or below 35° C. Following the addition, the mixture was stirred for one hour, and then filtered through a course filter to remove insolubles. The product was precipitated by slowly adding to 6 L of 2 percent HCl. The precipitate was stirred one hour in the precipitation media and then filtered. The solid was broken up and slurried twice in 2 L of deionized water, twice in 4 L of methanol, filtered and vacuum dried at ambient temperature at a pressure of about 125 mm Hg. About 184 g (60 percent of theory) of a yellow solid was obtained and found to be essentially free of molecules with acidic hydrophilic groups. The resulting compound is that of formula 3.

EXAMPLE 6

A mixed ester PAC of the condensate of xylenol and bis(methylol)cresol 1 parts by weight of the acid catalyzed condensation product of 2,6-dimethyllphenol and 2,6-bis(hydroxymethyl)-4-methylphenol and 2 parts by weight of naphthoquinone-(1.2 )-diazide-(2)-4-sulfonyl chloride are dissolved in 129 g of tetrahydrofuran. With stirring, a solution of 8.5 g of triethylamine and 1,0 g of 4-dimethylaminopyridine in 9.5 g tetrahydrofuran was slowly added over a 50 minute period. After the reaction mixture was stirred an additional 6 hours at room temperature 5 ml deionized water was added and the mixture stirred for an additional 20 minutes. The reaction mixture was acidified with 6 ml of concentrated HCl and then added to 6 volumes of vigorously stirred 2 percent sulfuric acid. The resulting precipitate was collected by filtration, washed twice with fresh deionized water and dried at 23° C. under partial vacuum to yield 26.3 g (96.3 percent of theoretical) of product. The resulting compound is that of formula 1.

EXAMPLE 7:

Description of the preparation of bis(phenylazo)resorcinol

Bis(phenylazo)resorcinol isomers were prepared according to a procedure similar to that described in *Helvetica Chimica Acta*, pp. 1816–1823 (1958). In a 2 liter flask, 37.2 g of aniline was added to 120 ml of water, and to this solution was added 100 ml of concentrated HCl and the solution was cooled to 5° C. 58.58 g of isoamyl nitrite was then added slowly. In a second 3 liter flask, 160 g of sodium acetate was added to a stirred solution of 44.4 g of resorcinol in 440 ml of water and dissolved. Then, the above diazonium solution was added in a thin stream to the resorcinol solution with vigorous stirring. Stirring continued for 2 hours, and an orange-red product precipitated out. Since reaction above occurs in acid solution, the predominant amount of the isomer in the orange red product is the 2,4-bis(phenylazo) resorcinol isomer (see FIG. 1 in *Helvetica Chimica Acta* identified above.

The precipitate was dissolved into 2 liters of 2 molar NaOH/water. This was slowly added with vigorous stirring to 3 liters of 2 molar HCl/water and stirred for 30 minutes to form an orange-red precipitate. The solids were slurried in 6 molar KOH/ethanol, acidified, filtered and dried. Yield was 56 g of product. The product was analyzed by mass spectroscopy: $C_{18}H_{18}O_2N_4$, molecular weight 318; observed M+ =318, M+H=319.

The products were separated on a Waters Model 510 high-pressure liquid chromatograph with a Walters Model 481 multi-wavelength detector operating at 365 nm using a Waters C18 reverse phase NovaPAK column. 7:3 spectrograde acetonitrile:water with 0.1% phosphoric acid was used as the mobile phase. The flow rate was 5 ml/min. Two major components were detected and identified by comparison to a sample of 85% pure (4-phenylazo)resorcinol obtained from Aldrich Chemical Company. The synthesized dye showed the 4-(phenylazo)resorcinol product at a retention time of about 1.2 min, and the bis(phenylazo)resorcinol product at a retention time of about 2.8 min. The product distributions from the synthesis according to this analytic method are listed in Table 1. The actual amount of bis(phenylazo)resorcinol is actually much greater than indicated, because analysis at 365 nm will significantly underestimate the amount of bis(phenylazo)resorcinol. Detector response is a function of both the concentration of the particular compound and its absorbance at that particular wavelength.

TABLE 1

| Bis(phenylazo)resorcinol Synthesis | | |
|---|---|---|
| COMPOUND | RETENTION TIME | PERCENTAGE |
| (4-phenylazo)-resorcinol | 1.2 min | 45.9 |
| bis(phenylazo)-resorcinol | 2.8 min | 51.8 |
| Impurities | | 2.3 |

EXAMPLE 8:

Absorbance properties of the (phenylazo)resorcinol condensate

A saturated solution of a 66.3:33.7 ratio of 4-phenylazo)resorcinol to bis(phenylazo)resorcinol in tetrahydrofuran was prepared and deposited on a glass thin layer chromatographic plate coated with Analtech Silica G gel according to standard chemical techniques. The (phenylazo)resorcinol isomers were developed using a 9:1 solution of cyclohexane:ethyl acetate to give $R_f$ values of 0.115 for (4-phenylazo)resorcinol and 0.211 for (2-phenylazo)resorcinol. The colored bands corresponding to these compounds were removed from the plate and isolated by dissolving into tetrahydrofuran, filtering and evaporation.

Ultraviolet/visible spectra were measured in spectrograde tetrahydrofuran on a Hewlett-Packard Model 8450A spectrometer. The absorbance at 436 nm, $A_{436nm}$, is listed relative to the absorbance at the absorption maximum, $A_{max}$ in Table 2:

TABLE 2

| Absorption Properties of (Phenylazo)resorcinol Isomers | | | |
|---|---|---|---|
| COMPOUND | $R_f$ | ABSORPTION MAXIMUM | $A_{436 nm}/A_{max}$ |
| (4-phenylazo)-resorcinol | 1.2 min | 387 nm | 0.394 |
| bis(phenylazo)-resorcinol | 2.8 min | 434 nm | 0.999 |

The low absorbance of the (4-phenylazo)resorcinol dye at the lithographically important mercury emission line at 436 nm restricts its usefulness in lithographic applications using 436 nm radiation. In order to achieve lithographic utility with the (4-phenylazo)resorcinol dye, a very high dye concentration would be required. Such high dye concentrations can cause an adverse effect on the dissolution response and thermal properties of the photoresist. The bis(phenylazo)resorcinol dye compound, in comparison, has a strong absorbance at the lithographically important mercury emission line at 436 nm.

EXAMPLE 9 THOUGH 11

Lithographic evaluations of photoresist compositions containing dye compounds which are strongly absorbant at 436 nm.

The photoresist compositions (Examples 9 through 11 in Table 3) were prepared by dissolving 2.432 g of the PAC of example 4, x g of bis(phenylazo)resorcinol dye compound, 10.168-x g of the resin of example 1 into a solvent mixture consisting of 22.44 g of ethyl lactate, 11.22 g of anisole and 3.74 g of amyl acetate. The solution was filtered through a 0.2 μm filter prior to use.

Resolution has an exact physical definition in terms of modulation of intensity between adhacent images (as described by P. S. Gwozdz, *Proc. SPIE*, Vol. 275 p. 156–164, 1981.) The most demanding and a proper method for measuring actual differences in resist resolution is to examine equal multiple equal line/space features printed on a phototool at a small enough feature size to degrade the aerial image of the light intensity (as explained by P. D. Flanner III, S. Subramanian and A. R. Neureuther, *Proc. SPIE*, Vol. 633, p. 239–244, 1986). For this purpose, we have used a Perkin-Elmer 341 scanning optical projector to print multiple equal 1.25 μm line/space patterns. Commercially available resists perform poorly under these conditions, giving very sloped sidewall angles and rounded tops of raised lines.

The resist compositions were evaluated by spin-coating films onto a 4 inch silicon wafer using a track hotplate soft-bake set at 115° C. for 45 seconds. The resist films were exposed in the said manner described above. The resist compositions were developed by immersing into a bath of 0.245 molar aqueous tetramethylammonium hydroxide at 22° C. for 60 seconds, followed by rinsing in water. The resulting patterns were inspected by a scanning electron microscope.

TABLE 3

Lithographic Evaluations of Dyed Photoresist Compositions

| EXAMPLE | g of DYE | FT[1] | FTR[2] | EE[3] | Eo[4] | RESOLUTION[5] |
|---|---|---|---|---|---|---|
| 9 | 0.203 | 1.2 | >99% | 79.2 | 40.5 | 1.25 |
| 10 | 0.407 | 1.2 | >99% | 94.2 | 46.8 | 1.25 |
| 11 | 0.508 | 1.2 | >99% | 108 | 55.0 | 1.50 |

Note: Residual amounts of (4-phenylazo)resorcinol may also be present in the dye.
[1]Film thickness in μm.
[2]Percent of original unexposed film thickness remaining.
[3]Exposure energy, 2 μm equal lines and spaces pattern, mJ/cm2.
[4]In mJ/cm2.
[5]In μm, equal lines/spaces pattern.

EXAMPLE 12 THROUGH 15

Photoresist Compositions with Mixtures of Dyes

Photoresist compositions containing a mixture of dyes can have certain advantages when compared to other photoresist compositions containing a single dye. The advantages of a mixture of dyes relate to improved control of the dissolution response, better solubility of the dyes, better photoresist stability, and an improved balance of absorption at the lithographically important wavelengths of 365 nm, 404 nm and 436 nm.

The photoresist compositions (Examples 12 and 13 in Table 4) were prepared by dissolving 2.432 g of the PAC of example 4, x g of dye compound A, y g of dye compound B, 10.168-x-y g of the resin of example 1 into a solvent mixture consisting of 22.44 g of ethyl lactate, 11.22 g of anisole and 3.74 g of amyl acetate. The solution was filtered through a 0.2 μm filter prior to use. The compositions are tabulated in Table 4.

The resist compositions were evaluated by spin-coating films onto a 4 inch silicon wafer using a track hotplate soft-bake set at 115° C. for 45 seconds. The resist films were exposed in the said manner described above. The resist compositions were developed by immersing into a bath of 0.245 molar aqueous tetramethylammonium hydroxide at 22° C. for 60 seconds, followed by rinsing in water. The resulting patterns were inspected by a scanning electron microscope and are tabulated in Table 5.

TABLE 4

Mixed-Dyed Photoresist Compositions

| EXAMPLE | DYE A | g of DYE A | DYE B | g of DYE B |
|---|---|---|---|---|
| 12 | bis(phenylazo)resorcinol | 0.1 | 4-(phenylazo)resorcinol | 0.1 |
| 13 | bis(phenylazo)resorcinol | 0.1 | Disperse Yellow 54 | 0.1 |

TABLE 5

Lithographic Evaluations of Mixed-Dyed Photoresist Compositions

| EXAMPLE | COMPOSITION OF EXAMPLE | FT[1] | FTR[2] | EE[3] | RESOLUTION[4] |
|---|---|---|---|---|---|
| 14 | 12 | 1.2 | >99% | 76.2 | 1.25 |
| 15 | 13 | 1.2 | >99% | 89.5 | 1.25 |

[1]Film thickness in μm.
[2]Percent of original unexposed film thickness remaining.
[3]Exposure energy, equal lines and spaces pattern, mJ/cm².
[4]In μm, equal lines/spaces pattern.

EXAMPLE 16 THROUGH 20

Non-Bleachable Absorption Properties of Photoresist Compositions

Non-bleachable absorbance is the absorbance of a photoresist film which remains following photodecomposition of the PAC. The dyed photoresist compositions of this invention have a substantial non-bleachable absorption which acts to absorb significant amounts of reflected light, and thus diminish the adverse effects of said reflective light.

Non-bleachable absorption was measured using the photoresist compositions of Examples 9 through 13. Films were spincoated on quartz substrates and baked in an oven at 100° C. The photoresist films were irradiated with substantial portions of actinic radiations to cause complete photodecomposition of the PAC. The remaining non-bleachable absorption, B, was determined for the following wavelengths: 436 nm, 404 nm and 365 nm. B is given by the following formula:

$$B = 2.303\, a/FT$$

where a is the absorbance of the film as measured by the spectrophotometer, and FT is the film thickness in units of micrometers. The resulting non-bleachable absorptions are tabulated in Table 6.

TABLE 6

Absorbance of Dyed Photoresist Compositions

| EXAMPLE | COMPOSITION OF EXAMPLE | B, 365 nm | B, 404 nm | B, 436 nm |
|---|---|---|---|---|
| 16 | 9 | 0.437 | 0.365 | 0.329 |
| 17 | 10 | 0.696 | 0.665 | 0.611 |
| 18 | 11 | 0.821 | 0.817 | 0.738 |
| 19 | 12 | 0.410 | 0.348 | 0.259 |
| 20 | 13 | 0.322 | 0.357 | 0.491 |

EXAMPLE 21 THROUGH 24

Dissolution Rate Effects of Dye

In order to achieve good photospeed, it is important that the dye does not appreciably diminish the dissolution rate of the exposed photoresist in developer.

The effect of dye on dissolution rate was determined by comparing the dissolution rate of a film of the resin of example 1 to the dissolution rate of a film composed of dye and the said resin. The compositions were evaluated by spin-coating films onto a polished 4-inch diameter silicon wafer using a track hot-plate soft-bake set at 115° C. for 45 seconds and measuring the bulk dissolution rate in 0.245 molar aqueous tetramethylammonium hydroxide using a Perkin Elmer DRM instrument. The results are tabulated in Table 7, with dissolution rates given in units of μm/sec.

TABLE 7

Dissolution Rate Effects of Dyes

| EXAMPLE | DYE | % DYE IN FILM | FILM THICKNESS | DISSOLUTION RATE |
|---|---|---|---|---|
| 21 | — | 0.00 | 1.2 | 0.0188 |
| 22 | bis(phenylazo)resorcinol | 1.75 | 1.2 | 0.0215 |
| 23 | bis(phenylazo)resorcinol | 3.00 | 1.2 | 0.0230 |
| 24 | bisphenyl- | 7.00 | 1.2 | 0.0300 |

TABLE 7-continued

Dissolution Rate Effects of Dyes

| EXAMPLE | DYE | % DYE IN FILM | FILM THICKNESS | DISSOLUTION RATE |
|---|---|---|---|---|
| | azo)resorcinol | | | |

EXAMPLE 25

Photoresist Composition with the Resin of Example 2

Dyed photoresist compositions containing the resin of example 2 can similarly offer the unique combination of high resolution, low exposure dose and high unexposed film thickness remaining after development.

A photoresist composition similar to Example 9 was prepared by dissolving 2.432 g of the PAC of example 4, 0.1 g of (4-phenylazo)resorcinol, 0.1 g of the dye of bis(phenylazo)resorcinol and 9.965 g of the resin of example 2 into a solvent mixture consisting of 22.44 g of ethyl lactate 11.22 g of anisole and 3.74 g of amyl acetate. The solution was filtered through a 0.2 μm filter prior to use.

The resist composition was evaluated by spin-coating a film onto a 4 inch silicon wafer using a track hot-plate soft-bake set at 115° C. for 45 seconds. The resist film was exposed in the said manner described above. The resist composition was developed by immersing into a bath of 0.245 molar aqueous tetramethylammonium hydroxide at 22° C. for 60 seconds, followed by rinsing in water. The resulting patterns were inspected by a scanning electron microscope. Results are tabulated in Table 8.

TABLE 8

| Composition with Resin of Example 2 | |
|---|---|
| PROPERTY | RESULT |
| Exposure Energy | 65 mJ/cm$^2$ |
| Eo | 30.3 mJ/cm$^2$ |
| Resolution | 1.25 μm |
| Unexposed Film Thickness Remaining | >99% |
| Scumming? | no |

EXAMPLE 26

Photoresist Composition with the Resin of Example 3

Dyed photoresist compositions containing the resin of example 3 can similarly offer the unique combination of high resolution and high unexposed film thickness remaining after development.

A photoresist composition similar to example 25 was prepared but using the resin of example 3.

The resist composition was processed similar to example 25. The resulting patterns were inspected by a scanning electron microscope. Results are tabulated in Table 9.

TABLE 9

| Composition with Resin of Example 3 | |
|---|---|
| PROPERTY | RESULT |
| Exposure Energy | 223 mJ/cm$^2$ |
| Eo | 93.8 mJ/cm$^2$ |
| Resolution | 1.25 μm |
| Unexposed Film Thickness Remaining | 99% |
| Scumming? | no |

EXAMPLES 27 and 28

Photoresist Compositions with Mixtures of Resins

Dyed photoresist compositions containing mixtures of resins of examples 1 and 3 can offer the improved resolution, lower exposure dose and high unexposed film thickness remaining after development.

The photoresist composition of example 25 was prepared by dissolving 2.432 g of the PAC of example 4, 0.1 g of the dye of (4-phenylazo)resorcinol, 0.1 g of the dye of bis(phenylazo)resorcinol, 7.972 g of the resin of example 1 and 1.993 g of the resin of example 3 into a solvent mixture consisting of 22.44 g of ethyl lactate, 11.22 g of anisole and 3.74 g of amyl acetate. The solution was filtered through a 0.2 μm filter prior to use.

The photoresist composition of example 25 was prepared by dissolving 2.432 g of the PAC of example 4, 0.1 g of the dye of (4-phenylazo)resorcinol, 0.1 g of the dye of bis(phenylazo)resorcinol, 8.968 g of the resin of example 3 and 0.997 g of a resin prepared by condensing acetone with cyclohexanone in the presence of an acid into a solvent mixture consisting of 22.44 g of ethyl lactate 11.22 g of anisole and 3.74 g of amyl acetate. The solution was filtered through a 0.2 μm filter prior to use.

The resist compositions were evaluated by spin-coating films onto 4 inch silicon wafer using a track hot-plate soft-bake set at 115° C. for 45 seconds. The resist films were exposed in the said manner described above. The resist compositions were developed by immersing into a bath of 0.245 molar aqueous tetramethylammonium hydroxide at 22° C. for 60 seconds, followed by rinsing in water. The resulting patterns were inspected by a scanning electron microscpe. Results are tabulated in Table 10.

TABLE 10

| Compositions with Mixed Resins | | |
|---|---|---|
| PROPERTY | EXAMPLE 27 RESULT | EXAMPLE 28 RESULT |
| Exposure Energy | 127 mJ/cm$^2$ | 235 mJ/cm$^2$ |
| Eo | 55 mJ/cm$^2$ | 103 mJ/cm$^2$ |
| Resolution | 1.25 μm | 1.25 μm |
| Thickness Remaining | >99% | 97% |
| Scumming? | no | no |

EXAMPLE 29

Photoresist Composition with the PAC of Example 6

Dyed photoresist compositions containing the PAC of example 6 can similarly offer the unique combination of high resolution, low exposure dose and high unexposed film thickness remaining after development.

A photoresist composition similar to example 9 was prepared by dissolving 2.432 g of the PAC of example 6, 0.1 g of the dye of (4-phenylazo)resorcinol, 0.1 g of the dye of bis(phenylazo)resorcinol, 10.168 g of the resin of example 1 into a solvent mixture consisting of 22.44 g of ethyl lactate, 11.22 g of anisole and 3.74 g of amyl acetate. The solution was filtered through a 0.2 μm filter prior to use.

The resist composition was evaluated by spin-coating films onto a 4 inch silicon wafer using a track hot-plate soft-bake set at 115° C. for 45 seconds. The resist film was exposed in the said manner described above. The resist composition was developed by immersing into a bath of 0.29 molar aqueous tetramethylammonium hydroxide at 22° C. for 60 seconds, followed by rinsing in water. The resulting patterns were inspected by a scanning electron microscpe. Results are tabulated in Table 11.

TABLE 11

| Composition with PAC of Example 6 | |
|---|---|
| PROPERTY | RESULT |
| Exposure Energy | 87 mJ/cm$^2$ |
| Eo | 42.5 mJ/cm$^2$ |
| Resolution | 1.25 μm |
| Unexposed Film Thickness Remaining | 97% |
| Scumming? | no |

EXAMPLES 30–36

Photoresist Compositions with Various Solvents

Photoresist compositions similar to Example 9 were prepared by dissolving 2.432 g of the PAC of example 4, 0.1 g of the dye of (4-phenylazo)resorcinol, 0.1 g of the dye of bis(phenylazo)resorcinol, 10.168 g of the resin of example 1 into 37.4 g of the following solvents: a 9:1 mixture of ethylene glycol monoethyl ether acetate (EGMEA) and butyl actetate (BA), propylene glycol monomethyl ether acetate (PGMEA), pyruvic aldehyde dimethyl acetal (PADA), hexyl acetate (HA), ethyl acetoacetate (EAA), methyl acetoacetate (MAA) and ethyl pyruvate (EP). The solutions were filtered through a 0.2 μm filter prior to use.

The resist compositions were evaluated by spin-coating films onto a 4 inch silicon wafers using a track hot-plate soft-bake set at 115° C. for 45 seconds. The film thicknesses of Examples 30 through 33 were 1.21 μm, and the film thicknesses of Examples 34 through 36 were 0.7 μm. The resist films were exposed in the said manner described above. The resist compositions were developed by immersing into a bath of 0.245 molar aqueous tetramethylammonium hydroxide at 22° C. for 60 seconds, followed by rinsing in water. The resulting patterns were inspected by a scanning electron microscpe. Results are tabulated in Table 12.

TABLE 12

| | Compositions with Various Solvents | | | |
|---|---|---|---|---|
| EXAMPLE | SOLVENT FOOD | Eo[1] | EE[2] | FTR[3] |
| 30 | 9:1 EGMEA:BA | 47.9 | 106.5 | 99% |
| 31 | PGMEA | 41.6 | 93 | 99% |
| 32 | PADA | 42.7 | 98.6 | >99% |
| 33 | EAA | 25.8 | 47.0 | 98% |
| 34 | HA | 27.8 | 61.3 | 98% |
| 35 | MAA | 23.1 | 46.1 | 99% |
| 36 | EP | 19.3 | 65.0 | >99% |

[1]Energy to clear large areas in mJ/cm$^2$.
[2]Energy to form equal lines/spaces pattern in mJ/cm$^2$.
[3]Percent film thickness remaining after development.

EXAMPLES 37 to 39

Demonstration of Reflection Control

The efficacy of the bis(phenylazo)resorcinol dye in greatly reducing reflective notching over reflective uneven semiconductor substrates was demonstrated as follows. Semiconductor substrates consisting of rounded parallel lines of pure aluminum, 0.8 μm high, 2 μm wide and spaced 2 μm apart, on silicon was baked to dehydrate the surface at 120° C. for 30 minutes in a forced air convection oven and then primed with liquid hexamethyldisilazane. The compositions of examples 9 and 11, and an identical composition containing no dye were spin-coated as films onto the substrates using a track hot-plate soft-bake set at 100° C. for 45 seconds. The coated substrates were exposed to light of 436 nm wavelength using a 0.42 numerical aperature Nikon wafer step-and-repeat printer. The reticle contained equal lines and spaces patterns o: various dimensions and was aligned in a manner to form an image in an orientation perpendicular to the rounded lines of aluminum. After exposure, the coated substrates were baked at 110° C. using a track hot-plate. The images were developed for 60 seconds at 25° C. in 0.245 molar aqueous tetramethyl ammonium hydroxide. The resulting patterns were examined using a scanning electron microscope to determine resolution in terms of the smallest surviving features, and the results are summarized in Table 13.

TABLE 13

| Evaluation of Reflection Control | | |
|---|---|---|
| EXAMPLE | COMPOSITION OF EXAMPLE | RESOLUTION |
| 37 | 9 | 0.6 μm |
| 38 | 11 | 0.6 μm |
| 39 | without dye | 0.9 μm |

The resist compositions of Examples 37 and 38 showed a substantial increase in useful resolution on the reflective substrate, with excellent linewidth control. The composition of Example 39, which did not contain dye, showed diminished resolution and very poor linewidth control because reflections from the reflective substrate resulted in the destruction of the smaller patterns.

EXAMPLES 40 and 41.

Deep-UV Curing Capability

The compositions of examples 9 and 11 were coated on wafers and patterned using the methods described in example 9. The patterned resist films were then subjected to a 50 to 150 mJ/cm$^2$ pre-flash exposure, followed by a dose of 25 J/cm$^2$ using an Optical Associates Incorporated Deep UV40KX Ultracure deep-UV curer with the substrates held at a temperature of 100° C. on a track hot-plate.

The resist films were then baked at 200° C. in a forced-air convection oven for 30 minutes. The resulting patterns were examined by scanning electron microscopy. No flow of the photoresist was found and the patterns remained angular. The experiments of Examples 40 and 41 demonstrate that these resist compositions are capable of being deep-UV cured to increase the thermal flow temperature to at least 200° C.

EXAMPLE 42

Comparative Photoresist Composition Containing Macrolex 6G Dye

In the prior art, most examples of dyed photoresist compositions contain Macrolex 6G dye. This dye compound is not significantly soluble in aqueous alkaline developers. As a result, it greatly reduces exposed photoresist dissolution rate, thus requiring large exposure doses. Also it has a tendancy to form undesirable scum on the semiconductor substrate. The resolution of the comparative example was inferior to the compositions of the present invention.

A photoresist composition similar to Example 9 was prepared by dissolving 2.432 g of the PAC of example 4, 0.203 g of Macrolex 6G dye (obtained from Mobay Corp.), 9.965 g of the resin of example 1 into a solvent mixture consisting of 22.44 g of ethyl lactate, 11.22 g of anisole and 3.74 g of amyl acetate. The solution was filtered through a 0.2 μm filter prior to use.

The resist composition was evaluated by spin-coating a film onto a 4 inch silicon wafer using a track hot-plate soft-bake set at 115° C. for 45 seconds. The resist film was exposed in the said manner described above. The resist composition was developed by immersing into a bath of 0.245 molar aqueous tetramethylammonium hydroxide at 22° C. for 60 seconds, followed by rinsing in water. The resulting patterns were inspected by a scanning electron microscpe. Results are tabulated in Table 14.

TABLE 14

| PROPERTY | RESULT |
|---|---|
| Exposure Energy | 132 mJ/cm² |
| Resolution | 2.0 μm |
| Unexposed Film Thickness Remaining | 96% |
| Scumming? | yes |
| Bulk dissolution rate | <0.002 μm/sec |

FORMULA 1

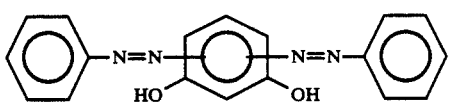

FORMULA 2

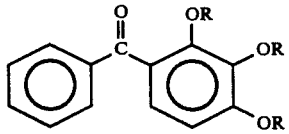

FORMULA 3

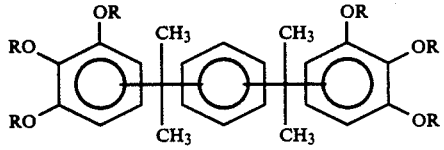

FORMULA 4

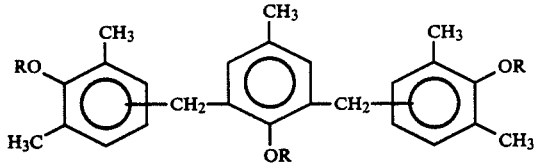

IN FORMULAE 2, 3 and 4

R = H, 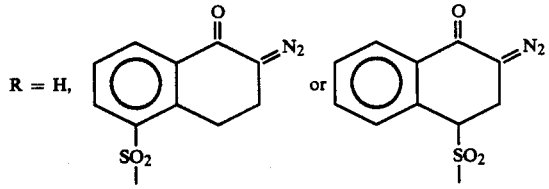

What we claim is:

1. A positive working photoresist composition comprising an admixture of an aqueous alkaline soluble polymeric resin, an organic photoacid, each in an amount sufficient to form a composition that is photoactive and capable of development following irradiation at a wavelength of from 365 to 436 nm, and a sufficient amount of 2,4-bis (phenylazo)resorcinol dye to adsorb stray reflections from a reflective surface at exposure wavelengths during irradiation.

2. A positive working photoresist composition comprising an admixture of a solvent and solid ingredients dissolved therein, said solvent being present in an amount sufficient to form a liquid coating composition and said solids, based by weight of total solids in said composition comprising:
   (a) from about 75 to about 92 percent of a mixture of a base soluble phenolic resin;
   (b) a 2,4-bis(azophenyl)resorcinol dye that exhibits an adsorption maxima at a wavelength of about 436 nm, said dye being present in an amount of from about 0.4 percent to about 8 percent of the weight of resin, and
   (c) from about 8 to about 25 percent of an o-naphthoquinone diazide ester of a polyhydroxy ballast group.

3. The composition of claim 2, wherein said dye is composed of a mixture of dyes containing at least 10 percent bis(phenylazo)resorcinol.

4. The composition of claim 2 wherein said o-naphthoquinone diazide ester is a polyester of a polyhydroxy ballast compound represented by the formula

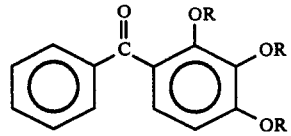

where each R is hydrogen or an o-naphthoquinone diazide group provided there is at least one o-naphthoquinone diazide group per molecule.

5. The composition of claim 2 wherein said o-naphthoquinone diazide ester is a polyester of a polyhydroxy ballast compound represented by the formula

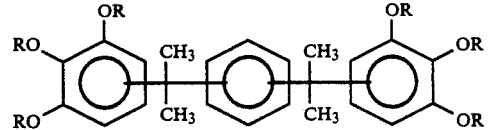

where each R is hydrogen or an o-naphthoquinone diazide group provided there is at least one o-naphthoquinone diazide group per molecule.

6. The composition of claim 2 wherein said o-naphthoquinone diazide ester is a polyester of a polyhydroxy ballast compound represented by the formula

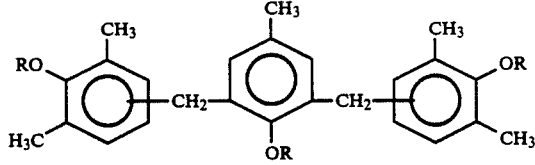

where each R is hydrogen or an o-naphthoquinone diazide group provided there is at least one o-naphthoquinone diazide group per molecule.

7. The composition of claim 2, wherein said resin is a condensation product of a mixture of at least two cresol isomers with formaldehyde in which the level of meta-cresol in said cresol mixture is less tha 45 percent of the total amount of the cresols.

8. The composition of claim 7, wherein said cresol isomers in said cresol mixture are present in amounts of less than 10 percent ortho-cresol, 43 to 46 percent meta-cresol and 54–57 percent para-cresol and said resin has a weight-average molecular weight of 4,000 to 35,000 Daltons.

9. The composition of claim 2, wherein said resin(s) is a polymer formed by condensing in the presence of an acid at least one bishydroxymethyl substituted phenolic compound and at least one reactive phenolic compound capable of sustaining polymerization.

10. The composition of claim 2, wherein said resin(s) is substantially a block copolymer formed by condensing in the presence of an acid a resin formed as defined in claim 9 wi(h formaldehyde and at least one reactive phenolic compound capable of sustaining polymerization.

11. The compositions of claims 9 and 10, wherein said bishydroxylmethyl substituted phenolic compound is 2,6-bis(hydroxymethyl)-p-cresol.

12. The composition of claim 2, wherein said resin is the polymer formed by condensing in the presence of an acid a mixture of at least one aromatic aldehyde with at least one reactive phenolic compound capable of sustaining polymerization, said polymer having a weight-average molecular weight of at least 1500 Daltons.

13. The composition of claim 12, wherein said condensation is conducted in the presence of an acid and a sulfur compound, said aromatic aldehyde is selected from the group consisting of benzaldehyde, salicylaldehyde, 3-hydroxybenzaldehyde, 4-hydroxybenzaldehyde and 1-naphthaldehyde and said reactive phenolic compound is meta-cresol.

14. The composition of claim 2, wherein the casting solvent contains at least 10 percent of a solvent chosen from the following group: ethylene glycol methyl ether actetate, propylene glycol methyl ether acetate, anisole, ethyl lactate, methyl lactate, ethyl-2-ethoxy acetate methyl-2-methoxy acetate, methyl-2-methoxy proprionate, pyruvic aledehyde dimethyl acetal, amyl actetate, butyl acetate, hexyl acetate, ethyl acetoacetate, butyrate, acetyl acetone, methyl acetoacetate, ethyl-2-hydroxyisobutyrate, ethyl-2-ethoxy-2-hydroxyacetate and methyl 3-hydroxybutyrate.

15. The compositions of claim 14, wherein the casting solvent contains at least 10 percent ethyl lactate.

16. A positive working photoresist composition comprising an admixture of an aqueous alkaline soluble polymeric resin, an organic photoacid, each in an amount sufficient to form a composition that is photoactive and capable of development following irradiation at a wavelength of from 365 to 436 nm, and a dye consisting essentially of a 2,4-bis(phenylazo) resorcinol dye alone or in combination with a (phenylazo) resorcinol dye, said bis(phenylazo)resorcinol dye being present in said composition in an amount sufficient to adsorb activating radiation at a wavelength of about 436 nm and sufficient to reduce reflection from a reflective surface during exposure.

17. The composition of claim 16 where the resin is novolak resin and the organic photoacid is an o-naphthoquinone diazide sulfonic acid ester.

18. The composition of claim 17 where the o-naphthoquinone diazide sulfonic acid ester is an ester of a hydroxy substituted benzophenone.

* * * * *